United States Patent [19]

DeConinck et al.

[11] 4,117,420
[45] Sep. 26, 1978

[54] PHASE-LOCKED LOOP WITH SWITCHABLE LOOP FILTER

[75] Inventors: Wilfried Rene' DeConinck; Jean Louis Ernest Raymond Goret, both of Brussels, Belgium

[73] Assignee: U.S. Philips Corporation, New York, N.Y.

[21] Appl. No.: 825,962

[22] Filed: Aug. 19, 1977

[30] Foreign Application Priority Data

Aug. 20, 1976 [NL] Netherlands ............... 7609251

[51] Int. Cl.$^2$ ............................................. H03B 3/04
[52] U.S. Cl. ........................................ 331/17; 331/14
[58] Field of Search .................. 331/17, 14; 328/141; 307/262

[56] References Cited

U.S. PATENT DOCUMENTS

| 3,287,657 | 11/1966 | Widl | 331/17 |
| 3,694,776 | 9/1972 | Lindner | 331/17 |
| 3,909,735 | 9/1975 | Anderson et al. | 331/17 |
| 3,993,958 | 11/1976 | Cutsogeorge | 331/17 |

Primary Examiner—John Kominski
Attorney, Agent, or Firm—Frank R. Trifari; Henry I. Steckler

[57] ABSTRACT

Phase-locked loop having a controllable oscillator and a phase detector for generating an output signal which is applied as control signal to the oscillator through a loop filter comprising a storage element, which loop filter is switchable under the control of a control circuit between a first state wherein the loop filter has a wide passband and a second state wherein the loop filter has a narrow passband, provided with an arrangement connected to said storage element for determining the instants at which the instantaneous value of the signal stored in the storage element is equal to the average value of the control signal for the oscillator, the control circuit being arranged such that, after locking, switching-over of the loop filter from the first to the second state is done at one of the instants determined by said arrangement.

4 Claims, 5 Drawing Figures

PHASE-LOCKED LOOP WITH SWITCHABLE LOOP FILTER

The invention relates to a phase-locked loop comprising an oscillator for supplying an oscillator signal having a frequency to be varied in dependency on a control signal and a phase detector to which the oscillator signal and a reference signal are applied for generating an output signal which is applied as control signal to the oscillator through a loop filter comprising a storage element, which filter is switchable under the control of a control circuit between a first state in which the loop filter has a wide passband and a second state in which the loop filter has a narrow passband.

Phase-locked loops are generally known and are frequently used to lock an oscillator on a given component of a frequency spectrum offered to the reference signal input of a phase detector.

The loop filter is switchable between a first state having a wide passband for realizing a large noise bandwidth of the phase-locked loop so that a large capture range and a rapid acquisition is obtained and a second state having a narrow passband for realizing a small noise bandwidth of the loop in order that the influence on the oscillator output signal of noise and phase jitter in the offered frequency spectrum can be reduced. See, for example, the book "Phaselock Techniques" by F. M. Gardner, John Wiley and Sons, Inc., 1966, page 53).

With signal transmission over telephone channels the phase jitter to which the offered frequency spectrum is subjected is produced by instabilities of the carrier oscillators, which instabilities are mainly associated with the mains supply. This phase jitter may be regarded as a low-index frequency modulation of all components of the offered frequency spectrum by a substantially sinusoidal signal having a frequency of 50 Hz. This implies that the frequency component to be selected is accompanied by sideband components spaced therefrom by 50 Hz and multiples thereof. If the loop filter is in the first state (wide passband) both the noise already present and also these sideband components produce interference in the control signal for the oscillator, the component spaced at 50 Hz from the component to be selected having the greatest influence.

The prior art application of such a switchable loop filter in a phase-locked loop has the drawback that when switching over from the loop filter having the wide passband to the narrow passband the initial locking of the phase-locked loop already obtained may get lost owing to these interferences present on the control signal.

It is an object of the invention to provide a phase-locked loop of the type described above in which, in spite of the noise and the phase jitter of the frequency spectrum the chance that at switch-over of the loop filter the initial locking of the loop is lost is reduced to a considerable extent.

The phase-locked loop according to the invention is therefore characterized in that connected to said storage element of the switchable loop filter there is an arrangement for determining the instants at which the instantaneous value of the signal stored in the storage element is substantially equal to the average value of the control signal for the oscillator and that the control circuit is arranged such that, after locking, switching over of the loop filter from the first to the second state occurs at one of the instants determined by said arrangement.

The invention will be further explained hereinbelow with reference to the drawing.

Figure 1:
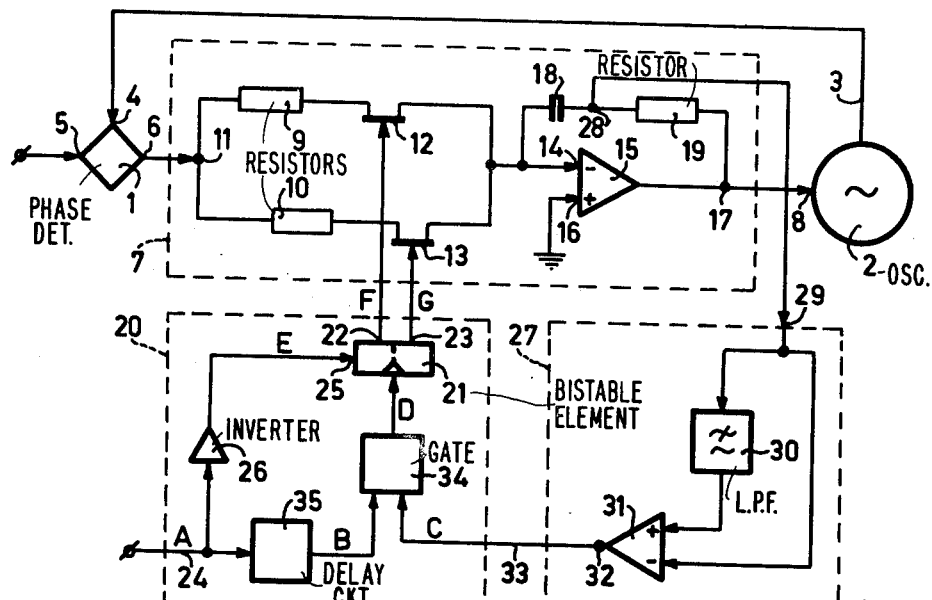
FIG. 1 shows a phase-locked loop according to the invention provided with a switchable loop filter.

The phase-locked loop of FIG. 1 comprises a phase detector 1 and a signal-controlled oscillator 2, the output signal of which is supplied through a lead 3 to a first input 4 of the phase detector 1. A reference signal is applied to a second input 5 of the phase detector 1. Phase detector 1 supplies at its output 6 an output signal which is applied through a switchable loop filter 7 as control signal to a control input 8 of the signal-controlled oscillator 2 for controlling the frequency of the oscillator signal. The switchable loop filter 7 comprises in the embodiment of FIG. 1 two, interconnected, resistors 9 and 10, having a low and high resistance value respectively, the mutual node 11 of which is connected to the output 6 of the phase detector 1 and which resistors are connected through switches 12 and 13 respectively to an inverting input 14 of an operational amplifier 15, a non-inverting input 16 of which is connected to a reference potential.

An impedance constituted by the series arrangement of a capacitor 18, which functions as a storage element, and a resistor 19 is connected between the inverting input 14 and an output 17 of the operational amplifier 15. Output 17 of the operational amplifier constitutes an output of the loop filter 7 and is connected to the control input 8 of the signal-controlled oscillator 2.

The switches 12 and 13 which may, for example, be constructed as field effect transistors ("FET's"), are controlled by switching signals which are derived from the control circuit 20 and which are picked-off from a bistable element 21 whose outputs 22 and 23 are connected to the gate electrodes of the field effect transistors 12 and 13 respectively. In a first stable state of the bistable element 21, switch 12 is conducting and switch 13 non-conducting, and the loop filter 17 is in a first state, having a wide passband ("acquisition mode"), owing to the fact that resistor 9 with small resistance value is switched on. In a second stable state of the bistable element 21, switch 13 conducts and switch 12 is non-conducting, and the loop filter 7 is in a second state having a narrow passband ("tracking mode"), owing to the fact that resistor 10 with high resistance value is switched on. If during the first state (wide passband) of the loop filter 7 an initial locking of the oscillator signal is realized, the control signal shows, owing to the interference passed by the loop filter 7, fluctuations which cause unwanted variations in the frequency of the oscillator signal. To reduce these variations, the loop filter 7 is switched over to the second state, with a narrow passband. Attainment of the initial locking of the oscillator signal is indicated by an indicator signal which may be obtained in various known ways, for example by means of a quadrature phase detector to which the reference signal and the 90° phase-shifted oscillator output signal is applied as is indicated in the book by Gardner mentioned above. Through a lead 24 this indicator signal is applied to control circuit 20. To switch the loop filter 7 back from the second to the first state on the loss of locking the bistable element 21 is provided with a resetting input 25 to which the indicator signal is applied through an inverting element 26.

With the known phase-locked loop described so far, the initial locking can get lost again when loop filter 7 is switched to the second state, owing to interference in the control signal. This unnecessarily delays the achieving of the desired locked state, because the filter would have to be switched back to its first state again.

In accordance with the invention the risk of loosing the locking when switching over from the first to the second state of the loop filter is considerably reduced because an arrangement 27 is present, connected to a capacitor 18 which functions as storage element, of the switchable loop filter 7 for determining the instants at which the instantaneous value of the signal stored in the capacitor 18 is substantially equal to the average value of the control signal for the oscillator 2 and the control circuit is arranged such that after locking, switch-over of loop filter 7 from the first to the second state is performed at one of the instants determined by the arrangement 27.

Figure 2:
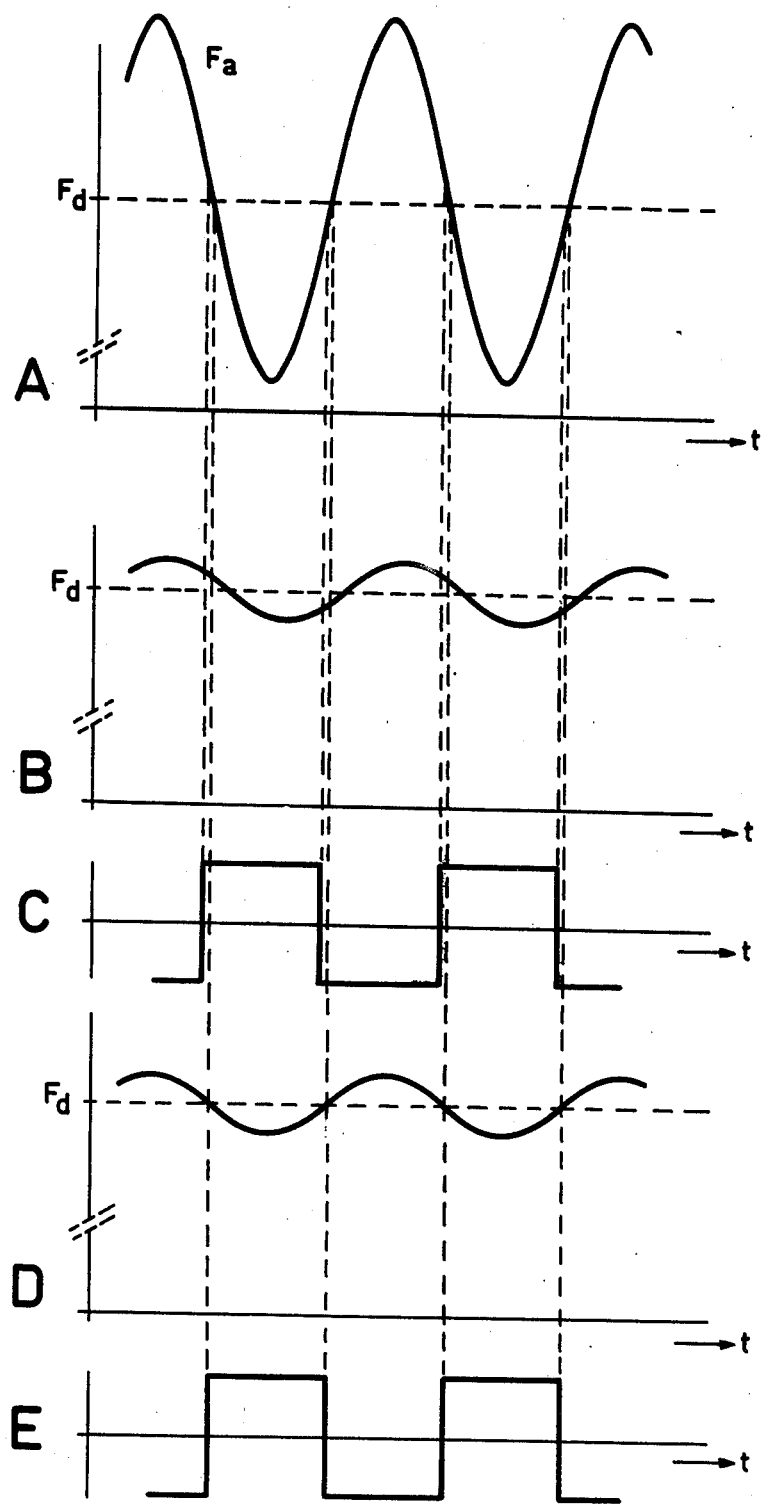
FIG. 2 shows a number of signals which may occur at different points in the phase-locked loop of FIG. 1.

In the embodiment shown in FIG. 1 arrangement 27 is connected to the node 28 of capacitor 18 and resistor 19. Assuming that the interference present on the reference signal is sinusoidal, the signal stored in capacitor 18 and occurring at the node 28 has after the initial locking, a shape as shown in FIG. 2A. Herein the signal consists of a constant term indicated by $F_d$ which is equal to the average value of the control signal and of a varying term $F_a$ owing to the sinsuoidal interference. The signal occurring at node 28 is applied to an input 29 of the arrangement 27 which arrangement comprises in the embodiment shown in FIG. 1 a low-pass filter 30 and a difference amplifier 31 to which the signal applied to the input 29 and shown in FIG. 2A is applied on the one hand directly and, on the other hand, through filter 30.

The variation in the signal occurring at the output of filter 30 is shown in FIG. 2B and is approximately representative of the average value of the control signal. The difference amplifier 31 determines the difference between the signals supplied thereto which are shown in FIG. 2A and FIG. 2B. The difference amplifier 31 is overdriven such that at an output 32 thereof output pulses are produced whose edges determine the instants at which the instantaneous value of the signal stored in the capacitor 18 is substantially equal to the average value of the control signal. These output pulses are shown in FIG. 2C.

The output pulses occurring at the output 32 of the difference amplifier 31 are applied through lead 33 to a gate circuit 34 which is part of the control circuit 20. Through lead 24 also the above-mentioned locking-indication signal is applied to the gate circuit 34, namely through a delay circuit 35 for bridging over the duration of the transient phenomena of filter 30. At an output of the gate circuit 34 setting pulses are produced for switching the bistable element 21 from the first to the second stable state, when during the presence of the locking-indication signal an edge of the output pulses which are applied through lead 33 occurs.

Figure 3:
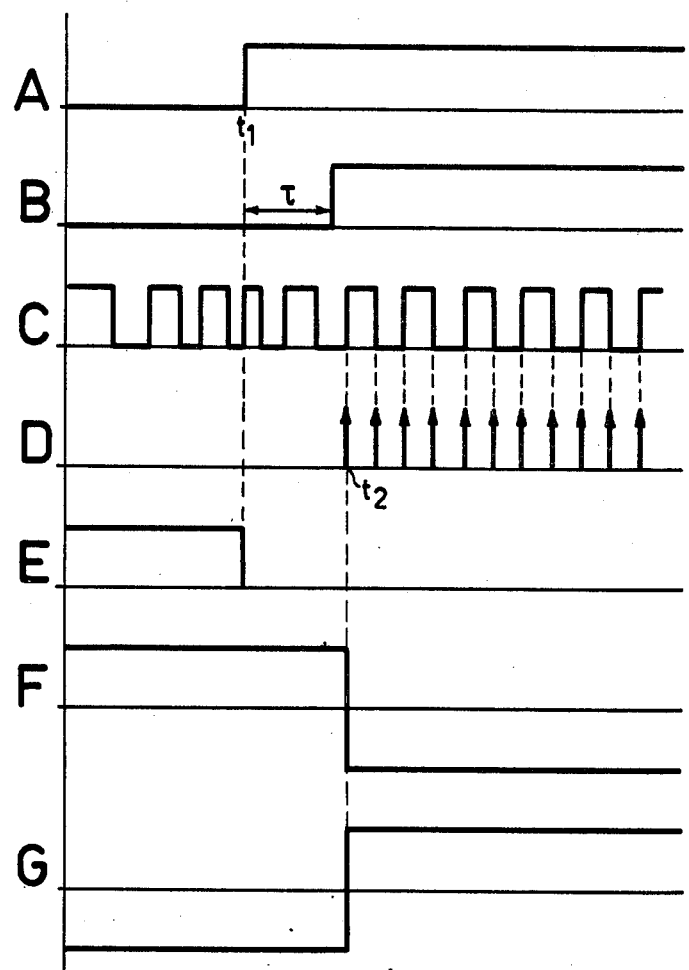
FIG. 3 shows a number of diagrams for explaining the operation of the control circuit in FIG. 1.

To explain the operation of the control circuit 20, FIG. 3 shows a number of time diagrams. FIG. 3A shows the locking-indication signal which is applied through lead 24. This indicates that after the instant $t_1$ the oscillator signal is locked. FIG. 3B shows the indication signal which is delayed by the delay circuit 35, $\tau$ being the delay produced by the delay circuit 35. The output pulses occurring at the output 32 of the difference amplifier 31 are shown in FIG. 3C, and FIG. 3D shows the set pulses for the bistable element 21 supplied by the gate circuit 34. Until the oscillator becomes locked, the reset pulse shown in FIG. 3E is applied to the reset input 25 of the bistable element 21. FIG. 3F and FIG. 3G show the switching signals which are derived from the outputs 22 and 23 and applied to the gate electrodes of the field effect transistors 12 and 13 respectively. Herein the loop filter 7 is in the first state (wide passband) until the instant $t_2$ and in the second state (narrow passband) after the instant $t_2$.

In the embodiment shown in FIG. 1 the filter 30 has for obtaining a sufficiently accurate representation of the average value of the control signals a relatively low cut-off frequency of, for example 15 Hz, and a correspondingly long transient period which time must be bridged over by said delay circuit 35.

Figure 4:
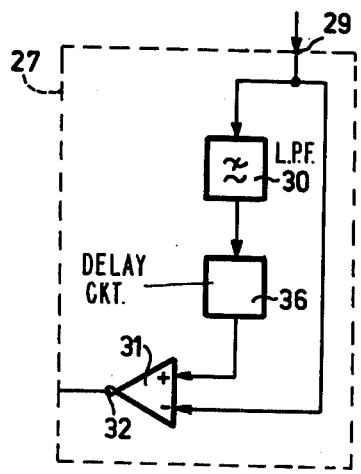
FIG. 4 shows a modified arrangement for determining said instants.

FIG. 4 shows a modification of the arrangement 27 shown in FIG. 1. This arrangement also comprises a lowpass filter 30 and a difference amplifier 31, but it differs therefrom by a delay circuit 36 included between filter 30 and difference amplifier 31 for correcting the phase shift introduced by the filter 30. The output signal of delay circuit 36 is shown in FIG. 2D, and the output pulses occurring at the output 32 of the difference amplifier 31 are shown in FIG. 2E.

In this embodiment an accurate indication is obtained of the instants at which the instantaneous value of the signal stored in the capacitor 18 is equal to the average value of the control signal in spite of a higher cut-off frequency of, for example, 30 Hz, of filter 30 and consequently a shorter transient period.

Figure 5:
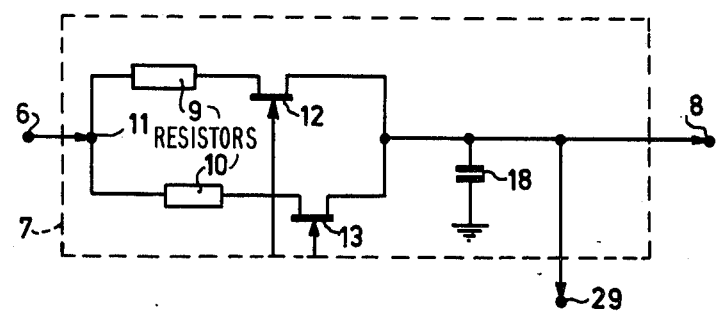
FIG. 5 shows a simple construction of a switchable loop filter for use in a phase-locked loop of FIG. 1.

FIG. 5 shows a simple construction of a switchable loop filter 7 wherein the elements which correspond with those in the loop filter of FIG. 1 have been given the same reference numerals. So this loop filter also comprises two interconnected resistors 9 and 10 which are connected through switches 12 and 13 respectively to the capacitor 18 which functions as a storage element. In this embodiment the control signal for the oscillator 2 is taken from capacitor 18 and, consequently, this control signal is equal to the signal stored in the capacitor 18.

It should be noted that, in certain circumstances, it may be necessary to adjust the value of resistor 19 of FIG. 1 in step with the adjustment of the passband of the loop filter 7, in order to maintain the stability of the phase-locked loop. This may be done, for example, by including two resistive branches, having a switch in each branch, between the capacitor 18 and output 17 instead of the single resistor 19. Switching over may then be done by operating these switches synchronously with the switches 12 and 13 by means of the bistable element 21.

What is claimed is:

1. A phase-locked loop, comprising an oscillator means for supplying an oscillator signal having a frequency to be varied in dependence upon a control signal, a phase detector having two input means for receiving the oscillator signal and a reference signal respectively and output means for generating an output signal, a loop filter having an input coupled to said detector output means and an output means for supplying said control signal to said oscillator, said filter comprising a storage element, said loop filter being switchable between a first state in which the loop filter has a wide passband and a second state in which the loop filter has a narrow passband, arrangement means coupled to said storage element of the switchable loop filter for determining the instants at which the instantaneous value of the signal stored in the storage element is substantially equal to the average value of the control signal for the oscillator, and a control circuit means coupled to said arrangement means and to said loop filter for providing that after locking switching-over of the loop filter from the first to the second state occurs at one of the instants determined by said arrangement means.

2. A phase-locked loop as claimed in claim 1, wherein the arrangement means for determining said instants comprises a low-pass filter coupled to said element and a difference amplifier having a pair of inputs coupled to said low-pass filter and to said element respectively, and an output means for supplying output pulses, wherein the edges of the output pulses occurring at the output of the difference amplifier indicate said instants.

3. A phase-locked loop as claimed in claim 2, further comprising a delay circuit coupled between the low-pass filter and the difference amplifier for correcting phase shift introduced by the low-pass filter.

4. A phase-locked loop as claimed in claim 2, said control circuit comprising input means for receiving an indication signal which indicates the instants at which locking is attained, a delay circuit and an inverting element both coupled to said control circuit input means, a gate circuit having a first input coupled to said delay circuit, a second input coupled to receive the output pulses of the difference amplifier, and an output means for providing output pulses, and a bistable element to which the output pulses of the gate circuit are supplied as setting pulses and to which the indication signal is applied as a resetting signal through said inverting element and from which the switching signals for the loop filter are derived.

* * * * *